United States Patent
Kull et al.

(10) Patent No.: US 9,614,540 B1
(45) Date of Patent: Apr. 4, 2017

(54) ASYNCHRONOUSLY CLOCKED SUCCESSIVE APPROXIMATION REGISTER ANALOG-TO-DIGITAL CONVERTER

(71) Applicant: International Business Machines Corporation, Armonk, NY (US)

(72) Inventors: Lukas Kull, Rueschlikon (CH); Thomas H. Toifl, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/934,195

(22) Filed: Nov. 6, 2015

(51) Int. Cl.
  *H03M 1/38* (2006.01)
  *H03M 1/46* (2006.01)
  *H03M 1/00* (2006.01)
  *H03M 1/06* (2006.01)

(52) U.S. Cl.
  CPC ........... *H03M 1/468* (2013.01); *H03M 1/002* (2013.01); *H03M 1/0604* (2013.01); *H03M 1/462* (2013.01)

(58) Field of Classification Search
  CPC .............................. H03M 1/002; H03M 1/462
  USPC ........ 341/118, 120, 110, 122, 155, 144, 163
  See application file for complete search history.

(56) References Cited

U.S. PATENT DOCUMENTS

| | | | |
|---|---|---|---|
| 8,134,487 B2 | 3/2012 | Harpe | |
| 8,344,925 B1 * | 1/2013 | Evans | H03M 1/462 341/118 |
| 8,669,896 B2 | 3/2014 | Tsai et al. | |
| 8,963,761 B2 | 2/2015 | Tsai et al. | |
| 9,041,569 B2 | 5/2015 | Zhou et al. | |
| 9,041,575 B2 | 5/2015 | Lien | |
| 2006/0055575 A1 * | 3/2006 | Van Tuijl | H03M 1/1215 341/155 |
| 2013/0135125 A1 * | 5/2013 | Schreiner | H03M 1/462 341/110 |
| 2014/0184436 A1 * | 7/2014 | Lee | H03M 1/1009 341/161 |
| 2014/0247170 A1 * | 9/2014 | Nagarajan | G06F 1/3296 341/155 |
| 2015/0171879 A1 * | 6/2015 | Kimura | H03M 1/468 341/118 |

OTHER PUBLICATIONS

Kull, Lukas, et al., "Energy Efficient High Speed SAR ADCs in CMOS", published in High Performance AD and DA Converters in Scaled Technologies, and time Domain Signal Processing, Switzerland: Springer International Publishing, 2014, abstract only.

(Continued)

*Primary Examiner* — Peguy Jean Pierre
(74) *Attorney, Agent, or Firm* — Harrington & Smith

(57) ABSTRACT

The exemplary embodiments relate to an asynchronously clocked successive approximation register analog-to-digital converter (SAR ADC) configured to provide a digital approximation of a sampled input signal as a result of an asynchronous successive approximation operation. The converter includes a regulation circuit configured to determine whether the asynchronous successive approximation operation was performed within a predefined conversion time and to regulate the SAR ADC such that the conversion time of the asynchronous operation is shifted towards the predefined conversion time. The embodiments further relate to a corresponding method and a corresponding design structure.

19 Claims, 8 Drawing Sheets

(56) References Cited

OTHER PUBLICATIONS

Verbruggen B., et al., "A 1.7 mW 11b 250 MS/s 2-times Interleaved Fully Dynamic Pipelined SAR ADC in 40 nm Digital CMOS", published in Solid-State Circuits, IEEE Journal of. vol. 47, Issue 12, Oct. 18, 2012. abstract only.

\* cited by examiner

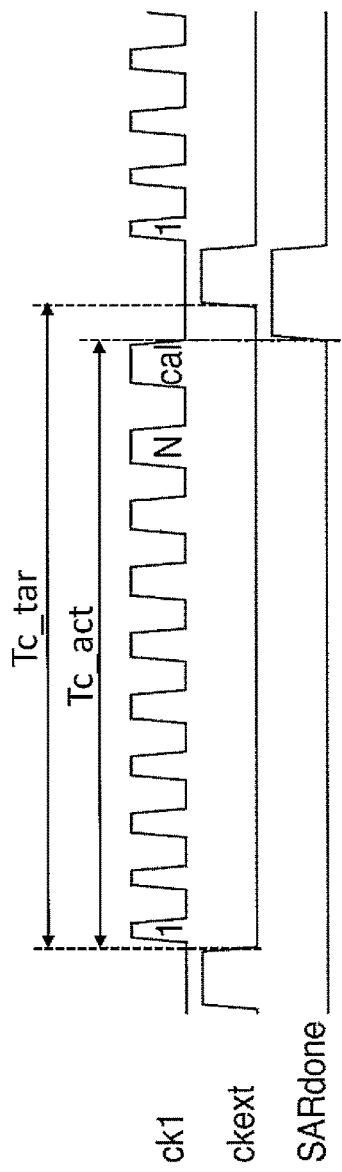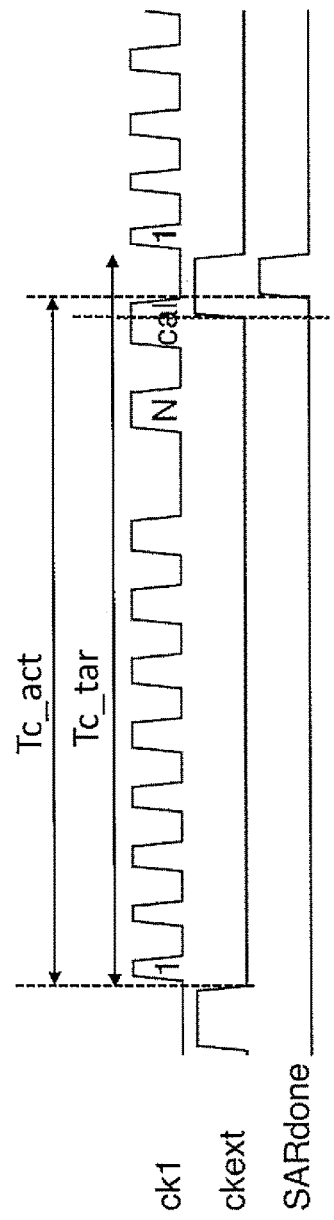
FIG. 3a
FIG. 3b

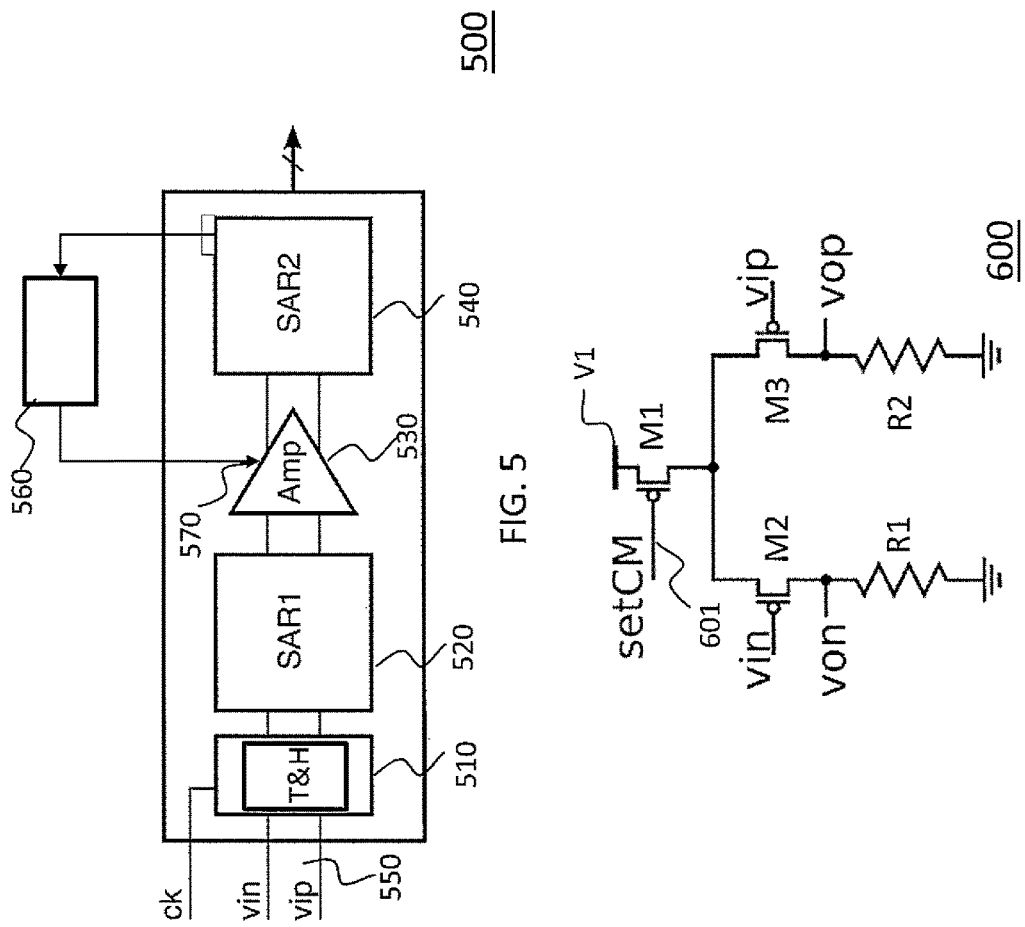

US 9,614,540 B1

ASYNCHRONOUSLY CLOCKED SUCCESSIVE APPROXIMATION REGISTER ANALOG-TO-DIGITAL CONVERTER

BACKGROUND OF THE INVENTION

The present invention relates to analog-to-digital converters, and more specifically to SAR converters (SAR=successive approximation register). The present invention further relates to a method for performing an analog-to-digital conversion by means of a SAR ADC and a design structure for designing, manufacturing, or testing an integrated circuit of a SAR ADC.

SAR converters for analog-to-digital conversion are well known in the art. In particular, SAR converters are frequently used since they provide a wide range of achievable resolution and conversion time and have competitive power efficiency. Furthermore, SAR converters can be implemented by utilizing the advantages of the CMOS technology, which are small-sized switches and capacitors having well-defined relative capacitances.

BRIEF SUMMARY OF THE INVENTION

According to a first aspect, the present invention is embodied as an asynchronously clocked successive approximation register analog-to-digital converter (SAR ADC). The SAR ADC is configured to provide a digital approximation of a sampled input signal as a result of an asynchronous successive approximation operation. The SAR ADC comprises a regulation circuit configured to determine whether the asynchronous successive approximation operation was performed within a predefined conversion time and configured to regulate the SAR ADC such that the conversion time of the asynchronous operation is shifted towards the predefined conversion time.

According to another aspect, the invention can be embodied as a method for performing an analog-to-digital conversion by means of an asynchronously clocked successive approximation register analog-to-digital converter (SAR ADC). The method comprises a step of providing a digital approximation of a sampled input signal as a result of an asynchronous successive approximation operation. The method comprises further steps of determining whether the asynchronous successive approximation operation was performed within a predefined conversion time and regulating the SAR ADC such that the conversion time of the asynchronous operation is shifted towards the predefined conversion time.

According to another aspect, the invention can be embodied as design structure tangibly embodied in a machine readable medium for designing, manufacturing, or testing an integrated circuit. The design structure comprises an asynchronously clocked successive approximation analog-to-digital converter (SAR ADC) configured to provide a digital approximation of a sampled input signal as a result of an asynchronous successive approximation operation. The SAR ADC comprises a regulation circuit configured to determine whether the asynchronous successive approximation operation was performed within a predefined conversion time and to regulate the SAP. ADC such that the conversion time of the asynchronous operation is shifted towards the predefined conversion time.

Devices and methods embodying the present invention will now be described, by way of non-limiting examples, and in reference to the accompanying drawings. Technical features depicted in the drawings are not necessarily to scale.

Also some parts may be depicted as being not in contact to ease the understanding of the drawings, whereas they may very well be meant to be in contact, in operation.

BRIEF DESCRIPTION OF SEVERAL VIEWS OF THE DRAWINGS

FIGS. 3*a* and 3*b* illustrate exemplary timing diagrams of SAR ADCs according to embodiments;

FIG. 5 shows an exemplary embodiment of a pipelined SAR ADC;

FIG. 6 shows an exemplary embodiment of a buffer with controllable common mode;

DETAILED DESCRIPTION OF THE INVENTION

In reference to FIGS. 1-10, some general aspects and terms of embodiments of the invention are described. Embodiments of the invention concern an asynchronously clocked successive approximation analog-to-digital converter (SAR ADC), and in particular a differential SAR ADC that converts differential input signals into a digital approximation. Embodiments of the invention further relate to a method for performing an analog-to-digital conversion by means of a SAR ADC and a design structure for designing, manufacturing, or testing an integrated circuit of a SAR ADC.

Embodiments of the invention comprise a regulation circuit for regulating the conversion time of the SAR ADC such that the conversion time of the asynchronous operation is shifted towards the predefined conversion time. Generally any control parameter of the SAR ADC that influences the conversion time of the asynchronous operation may be used for the regulation.

According to a preferred embodiment, a common mode of the SAR ADC is used as control parameter. As common mode of the SAR ADC it is in particular understood the common mode voltage at the input of the comparator of the SAR ADC. The common mode voltage of the comparator influences the decision time, noise and precision of the comparator itself and therewith also of the whole SAR ADC.

Figure 1:
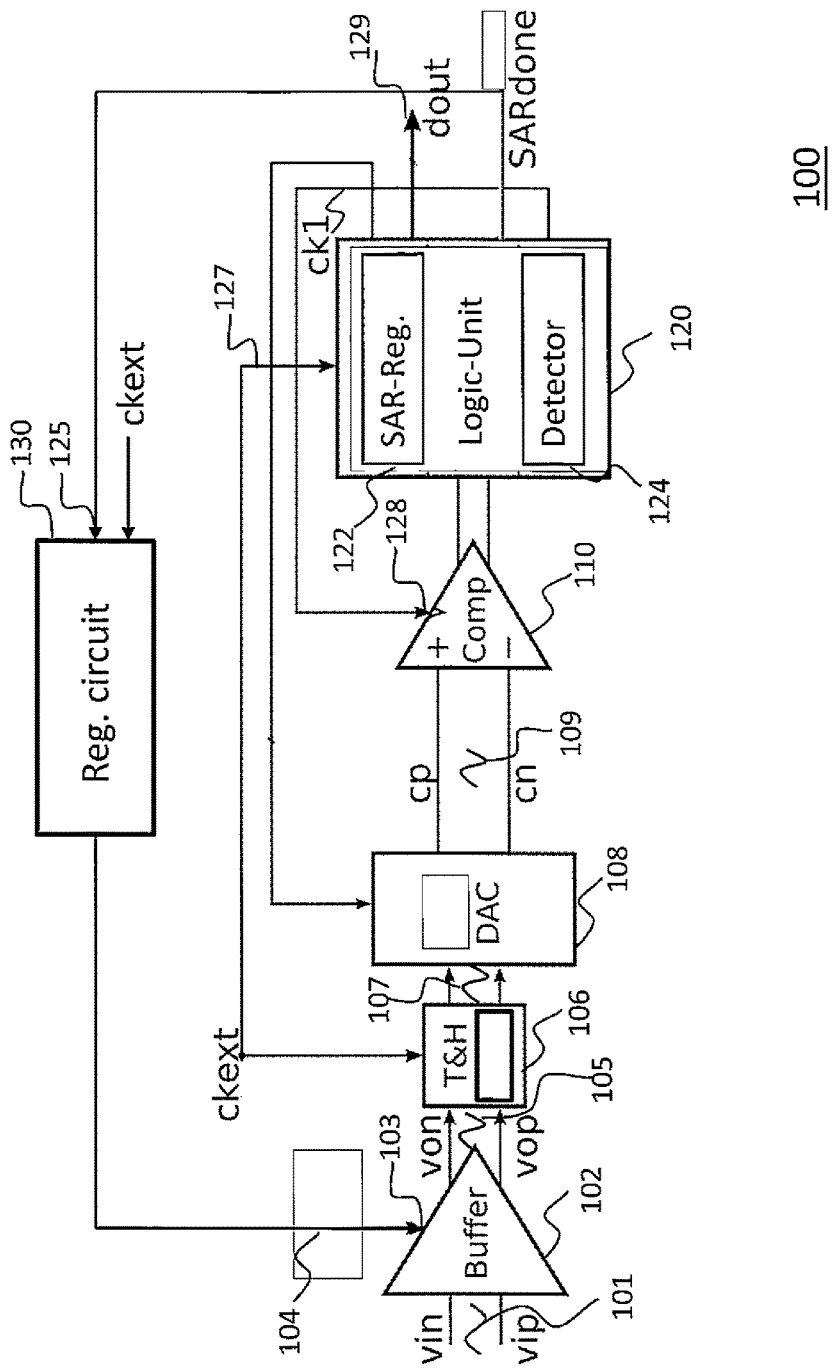
FIG. 1 is a block diagram of an asynchronously clocked successive approximation register analog-to-digital converter (SAR ADC) according to an embodiment of the invention.

FIG. 1 shows an exemplary embodiment of a SAR ADC 100. The SAR ADC 100 provides a digital approximation of a sampled input signal 101 as a result of an asynchronous successive approximation operation. The SAR ADC 100 is embodied as a differential SAR ADC. Accordingly the input signal 101 is a differential input signal comprising a positive input voltage vip and a negative input voltage vin. The input signal 101 is forwarded to a buffer 102. The buffer 102 comprises a regulation input 103 for receiving a regulation signal 104. The regulation signal 104 is operable to set the common mode of a differential buffer output signal 105 at the output of the buffer 102. The output of the buffer 102 is coupled to an input of a track & hold unit 106, also denoted as track & hold switch. The track & hold unit 106 is directly controlled by an external clock signal ckext. The track & hold unit 106 samples the differential buffer output signal 105 and provides a sampled signal 107 to a Digital-to-Analog Converter (DAC) 108. The DAC 108 may be embodied as capacitive DAC comprising capacitor banks on each of its input signal lines. The sampled signal 107 is kept constant during a conversion cycle of the SAR ADC 100. The SAR ADC 100 further comprises a comparator 110 and a logic unit 120. The DAC 108 provides a digital approximation of the sampled signal 107 and forwards the difference between the digital approximation and the sampled input signal 107 as comparator signal 109 to the input of the comparator 110. The comparator 110 may be e.g. a conventional operational amplifier and has an inverting and a non-inverting input, denoted with "−" and "+" respectively. The comparator 110 is configured to output an output signal to the logic unit 120 that indicates whether the differential input voltage applied between the non-inverting input and the inverting input of the comparator 110 is positive or negative. The comparator 110 serves for performing a plurality of decision steps and provides decision outputs to the logic unit 120.

The logic unit 120 of the SAR ADC 100 is adapted to fulfill a plurality of functions. It comprises memory to store the output of the comparator 110. It comprises a counter to count the number of decisions of the comparator 110 in order to know the current bit position of the conversion and to address the memory. It comprises furthermore a successive approximation register 122 for successively supplying an approximate digital code of the sampled signal 107 to the DAC 108.

The logic unit 120 of the SAR ADC 100 comprises further a detector 124 for providing a detection signal 125. The detection signal 125 indicates that the asynchronous successive approximation operation is completed, indicated in FIG. 1 by "SARdone".

The SAR ADC 110 is embodied as an asynchronous ADC. In other words, the conversion time for performing a successive approximation operation is not fixed and varies over time. Asynchronous ADCs may provide the advantage of shorter overall conversion time by removing waiting times during operation.

The logic unit 120 and the track & hold unit 106 are operable to receive an external clock signal 127, also denoted as ckext. The external clock signal ckext is periodic and has a fixed interval time. It may be provided e.g. from an external clock generator, in particular a clock generator that provides the clock for a system or circuit in which the SAR ADC 100 may be embedded. This may be in particular a system which uses and further processes the digital data dout provided by the SAR ADC 100. The clock cycle time of the external clock signal ckext may define a predefined conversion time in which the SAR ADC 100 is expected to perform on average a conversion cycle. The external circuit in which the SAR ADC 100 may be embedded is then designed or can be designed for this predefined conversion time. According to other embodiments, the predefined conversion time may be set to a fraction of the clock cycle time of the external clock signal ckext, e.g. to half of the external clock cycle time.

The logic unit 120 provides an internal clock signal 128, also denoted as ck1, to the comparator 110. The cycle time of the internal clock signal ck1 is not fixed and corresponds to the actual time that a conversion cycle needs for converting the sampled signal 107 into a digital approximation. This will be explained in more detail below with reference to FIG. 3a and FIG. 3b.

The SAR ADC 110 further comprises a regulation circuit 130 for regulating a common mode of the differential SAR ADC 110. The common mode of the SAR ADC 110 is determined and can be regulated by the buffer 102. The regulation circuit 130 is operable to receive the detection signal 125 from the logic unit 120 and to determine whether the asynchronous successive approximation operation was performed within the predefined conversion time. Accordingly the regulation circuit 130 is operable to receive the external clock signal ckext. This enables the regulation circuit 130 to determine whether the asynchronous successive operation was performed within the time period set by the external clock signal ckext. The regulation circuit 130 is coupled to the buffer 102 and sends the regulation signal 104, also denoted as setCM, to the regulation input 103 of the buffer 102. Accordingly the regulation circuit 130 is operable to regulate the common mode of the SAR ADC 110 such that the conversion time of the respective asynchronous operation is shifted towards the predefined conversion time.

Finally the logic unit 120 outputs a digital output signal 129, also denoted as dout. The digital output signal 129 is a digital representation of the sampled signal 107.

Figure 2:
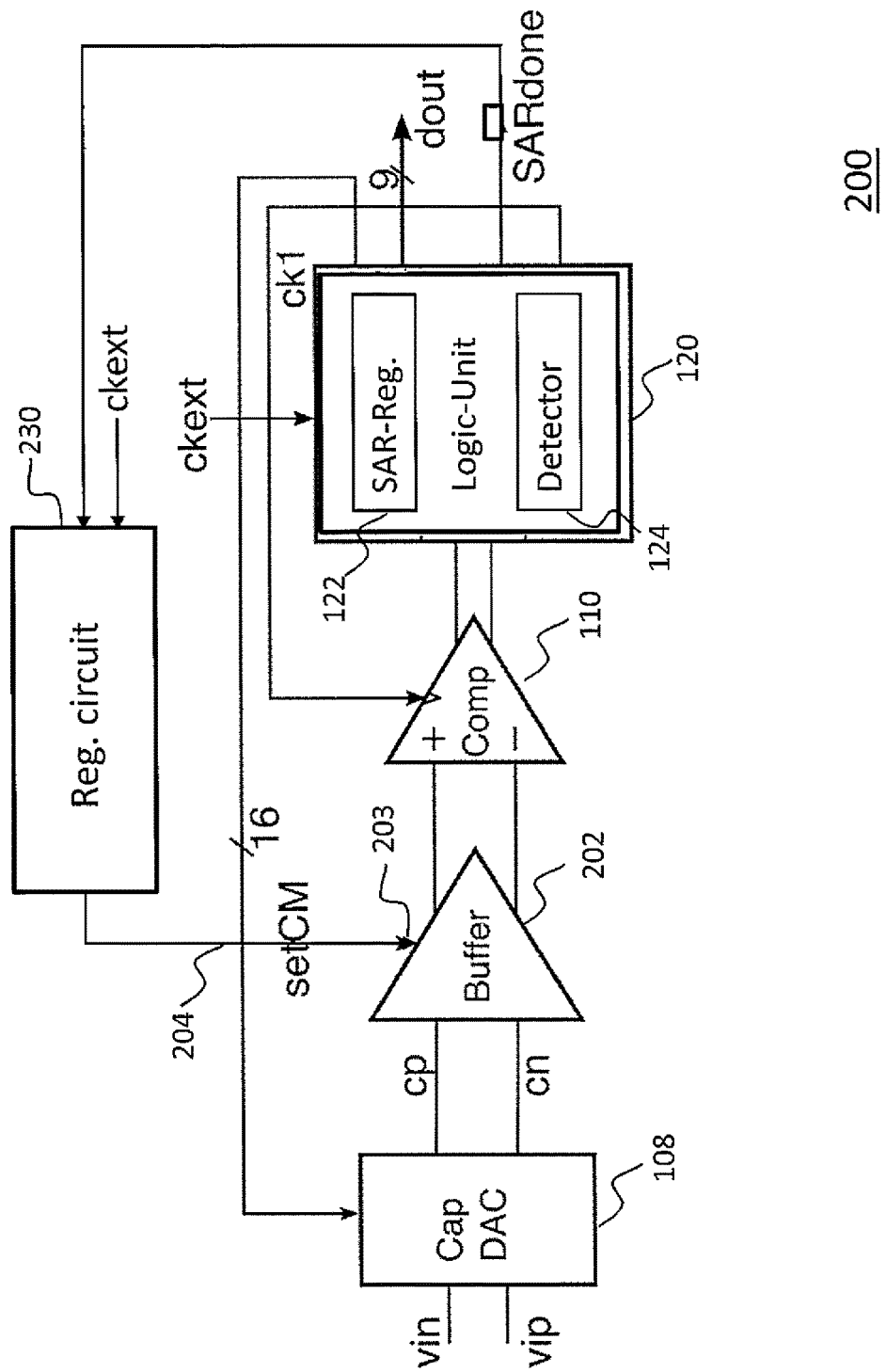
FIG. 2 is a block diagram of a SAR ADC according to another embodiment of the invention.

FIG. 2 shows another exemplary embodiment of a SAR ADC 200. The SAR ADC 200 may be e.g. a stage of a pipelined SAR ADC. The SAR ADC 200 corresponds in large parts to the SAR ADC 100 of FIG. 1. Accordingly, the numbering of FIG. 1 is used to denote corresponding elements and it is referred to the corresponding description of FIG. 1. In contrast to the SAR ADC 100 of FIG. 1, the SAR ADC 200 of FIG. 2 comprises a buffer 202 between the comparator 110 and the DAC 108. The buffer 202 determines the common mode of the comparator 110. Accordingly, the SAR ADC 200 comprises a regulation circuit 230 for regulating the common mode of the buffer 202. The regulation circuit 230 provides a regulation signal 204 to a regulation input 203 of the buffer 202.

FIG. 3a shows a first exemplary timing diagram of the SAR ADC 100 of FIG. 1 or the SAR ADC 200 of FIG. 2.

As explained above, the SAR ADC 100 is asynchronously clocked by the clock signal ck1 provided by the logic unit 120. As illustrated in FIG. 3a, the actual conversion time Tc_act is not constant for each bit decision. The time required for a complete decision of the comparator 110 may depend e.g. on the input voltage at the input of the comparator 110. Usually, the larger the input voltage difference, the faster the conversion. As the voltage difference for the Most Significant Bit MSBs is statistically larger than for the Least Significant Bit LSBs, the decision time for the MSBs is statistically shorter than for the LSBs. The conversion starts with the DAC 108 set to midscale.

In the example of FIG. 3a the comparator 110 performs N decision steps followed by a calibration step. Accordingly the clock signal ck1 comprises N pulses 1 to N followed by a calibration pulse cal. The falling clock edge of the external clock ckext triggers the SAR logic and initiates the decision phase of the comparator 110. The conversion time Tc_act ends with the falling edge of the calibration pulse cal. The falling edge of the calibration pulse cal triggers a detection signal SARdone which indicates to the regulation circuit 130 that a conversion cycle was completed. In the example of FIG. 3a the actual conversion time Tc_act of the shown conversion of the SAR ADC is shorter than the predefined conversion time, here denoted as target conversion time Tc_tar. The target conversion time Tc_tar is in this example given by the fixed period of the external clock signal ckext. In the example of FIG. 3a, the rising edge of the clock pulse of the external clock ckext is coming after the rising edge of the pulse SARdone. The regulation circuit 130 compares the time of the rising edges of the external clock ckext with the time of the rising edge of the pulse SARdone and determines that the asynchronous successive approximation operation was completed before the predefined conversion time, here Tc_act. Based on this determination, the regulation circuit 130 regulates the common mode of the SAR ADC 100 such that the conversion time of the asynchronous operation is shifted towards the predefined conversion time. In this example, this means that the regulation circuit 130 reduces the common mode of the SAR ADC 100. By this, the next asynchronous successive approximation operation will be a bit slower and hence shifted towards the predefined conversion time, here Tc_act. Associated with this shift is a reduction of the noise of the comparator 110 and a reduction of the power consumption of the SAR ADC 100.

At the end of the SAR conversion, the DAC 108 is reset to prevent inter-symbol interference (ISI) in the subsequent input sampling phase. The SAR ADC 100 is operable to reset the DAC 108 to calibrate the comparators. The calibration is initiated as soon as the DAC 110 is reset and prior to the next sampling phase.

FIG. 3b shows a second exemplary timing diagram of the SAR ADC 100 of FIG. 1 or the SAR ADC 200 of FIG. 2. The comparator 110 performs again N decision steps followed by a calibration step. Accordingly the clock signal ck1 comprises again N pulses 1 to N followed by a calibration pulse cal. In the example of FIG. 3b the actual conversion time Tc_act of the shown conversion of the SAR ADC is longer than the predefined conversion time Tc_tar set by the external clock ckext. Accordingly the rising edge of the clock pulse of the external clock ckext is coming before the rising edge of the pulse SARdone. The regulation circuit 130 compares the time of the rising edges of the external clock ckext with the time of the rising edge of the pulse SARdone and determines that the asynchronous successive approximation operation was completed only after the predefined conversion time Tc_tar. Based on this determination, the regulation circuit 130 regulates the common mode of the SAR ADC 110 such that the actual conversion time Tc_act of the asynchronous operation is shifted towards the predefined conversion time Tc_tar. In this example, this means that the regulation circuit 130 increases the common mode of the SAR ADC 100. By this, the next asynchronous successive approximation operation will be a bit quicker and hence shifted towards the predefined conversion time. Associated with this shift is an increase of the noise of the comparator 110 and an increase of the power consumption of the SAR ADC 100.

Figure 4:
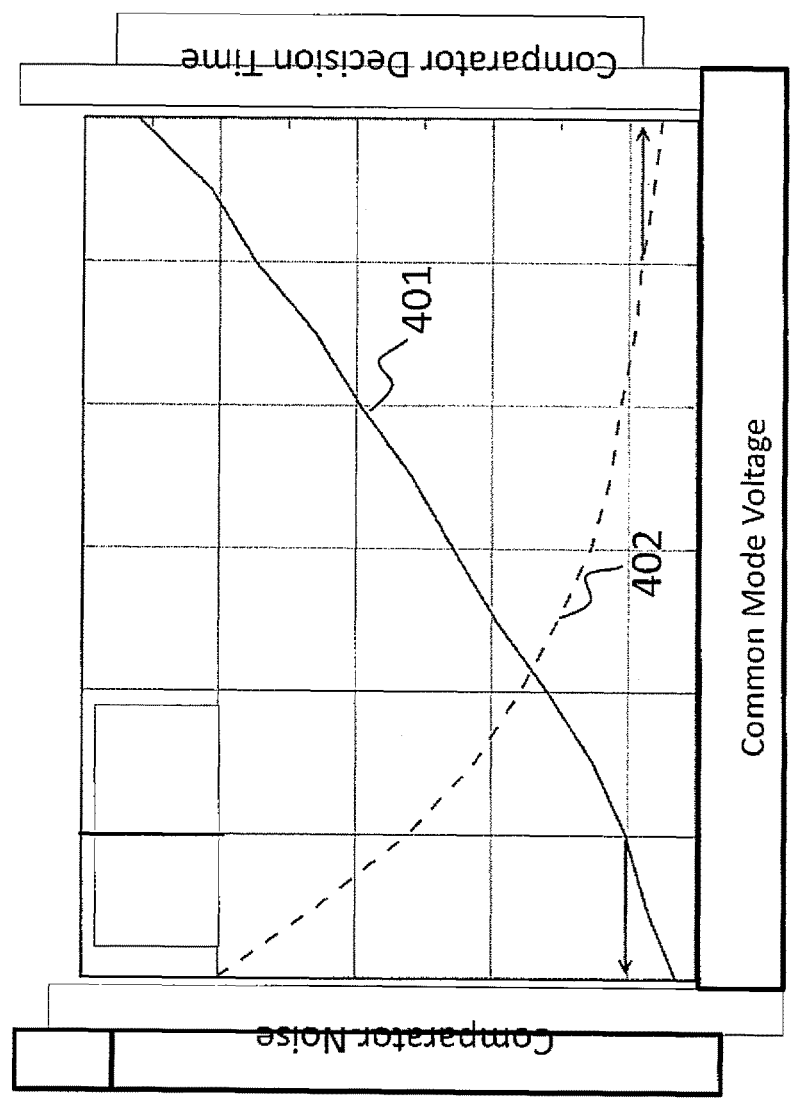
FIG. 4 shows a diagram of the decision time and the noise of a comparator in dependence on the common mode.

FIG. 4 illustrates in an exemplary, simplified and schematic way how the decision speed and the noise of the comparator 110 according to embodiments of the invention depends on the common mode voltage. The X-axis denotes the input common mode voltage of the comparator, the left Y-axis the comparator noise, and the right Y-axis the comparator decision time. The curve 401 illustrates the noise in dependence on the common mode voltage and the dotted curve 402 the comparator decision time. In general, the higher the input common mode of the SAR ADC 100, the shorter the decision time and hence the higher the speed of the comparator 110. On the other hand, the higher the input common mode, the higher the noise. A higher noise typically decreases the decision accuracy of the comparator 110. In addition, a higher input common mode is associated with a higher power consumption of the comparator 110.

Hence by regulating the input common mode of the comparator 110, the regulation circuit 130 can facilitate a trade-off between speed and noise of the comparator 110.

FIG. 5 shows a simplified block diagram of a pipelined SAR ADC 500. The pipelined SAR ADC 500 comprises a track & hold unit 510, a first stage 520, a second stage 540 and an amplifier 530 between the first stage 520 and the second stage 540. The track & hold unit 510 receives an external clock signal ckext (shown as ck) as well as a differential input signal 550 comprising a negative input voltage vin and a positive input voltage vip. The pipelined SAR ADC 500 comprises a regulation circuit 560 for regulating the common mode of the second stage 540 of the pipelined SAR ADC 500 such that the conversion time of the asynchronous operation of the second stage 540 is shifted towards the predefined conversion time of this second stage 540. The common mode of the second stage 540 is determined by the amplifier 530 in front of the second stage 540. Accordingly, the regulation circuit 550 provides a common mode regulation signal 570 to the amplifier 530, thereby regulating the common mode of the amplifier 530. In case of a pipelined ADC with a third, a fourth or more stages, a corresponding regulation circuit to regulate the further stages may be provided.

According to further embodiments, there might be provided also a regulation circuit for regulating the common mode of the first stage 520. The common mode of the first stage 520 would usually be determined by a not shown buffer in front of the track & hold unit 510. This would then correspond to a regulation circuit 130 regulating the common mode of the buffer 102 as illustrated with reference to FIG. 1.

FIG. 6 shows an exemplary embodiment of a buffer 600. The buffer 600 is implemented as a differential amplifier with a resistive load. The buffer 600 may be e.g. an exemplary implementation of the buffer 102 of FIG. 1. The buffer 600 comprises a first transistor M1. The gate of the transistor M1 receives a regulation signal 601 to set the common mode of the buffer 600. The drain of the transistor M1 is coupled to a supply voltage V1 and the source of the transistor M1 is coupled to the drains of a pair of transistors M2 and M3. The gate of the transistor M2 receives the negative signal vin of the differential input signal 101 of the SAR ADC 100. The gate of the transistor M3 receives the positive signal vip of the differential input signal 101 of the SAR ADC 100. The source of the transistor M2 is coupled via a resistor R1 to ground and the source of the transistor M3 is coupled via a resistor R2 to ground. The source of the transistor M2 provides the negative output signal von of the buffer output signal 105 and the source of the transistor M3 provides the positive output signal von of the buffer output signal 105. The drain of the transistor M2 is coupled to the source of the transistor M1 and the drain of the transistor M3 is also coupled to the source of the transistor M1.

In operation, the gate voltage of the transistor M1, controlled by the signal setCM, regulates the current through the transistors M2 and M3 and regulates thereby the common mode of the buffer 600.

Figure 7:
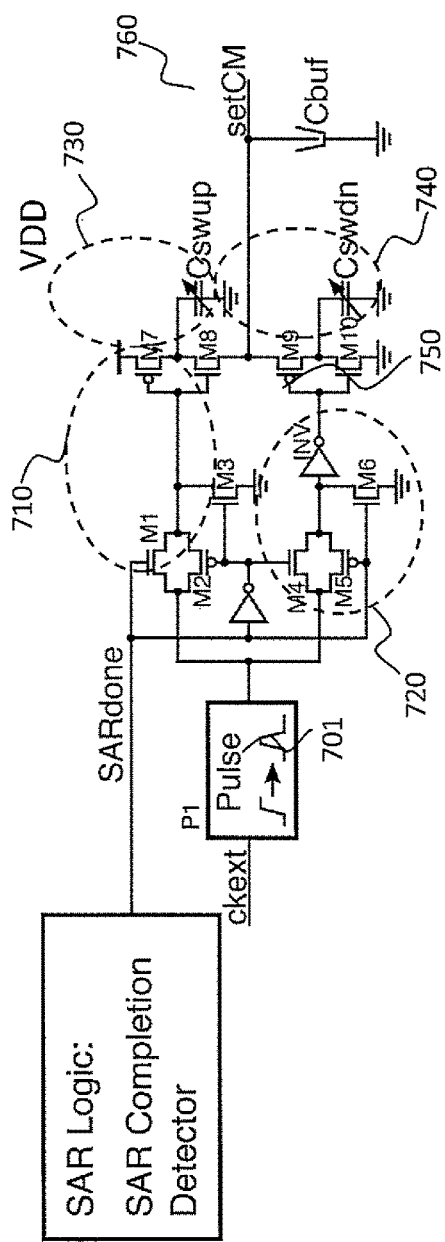
FIG. 7 shows a regulation circuit according to an embodiment.

FIG. 7 shows an exemplary embodiment of a regulation circuit 700 which may be an implementation of the general regulation circuits 130 or 230. The regulation circuit 700 receives the external clock signal ckext from an external clock source and the SARdone signal from the logic unit 120 of FIG. 1.

The regulation circuit 700 comprises a pulse generator 701 which receives the external clock signal ckext. The pulse generator 701 generates a pulse triggered by the rising edge of the external clock signal ckext. This pulse is then forwarded to a first transmission gate 710 comprising a pair of transistors M1 and M2 and a second transmission gate 720 comprising a pair of transistors M4 and M5. The first transmission gate 710 further comprises a transistor M3 which sets the voltage level at the output of the first transmission gate 710 to ground when the first transmission gate 710 is disabled.

The second transmission gate 720 further comprises a transistor M6 which sets the voltage level at the output of the second transmission gate 720 to ground when the second transmission gate 720 is disabled.

The pulse generated by the pulse generator 701 is forwarded via the first transmission gate 710 to an upper inverter 730 implemented by a pair of transistors M7 and M8 or via the second transmission gate 720 to a lower inverter 740 implemented by transistors M9 and M10. If SARdone is high when the pulse is generated by the pulse generator 710, the lower inverter 740 is triggered, else the upper inverter 730. An inverter 750 is provided to invert the pulse on the lower path. When the lower inverter 740 is triggered, a capacitor Cswdn, which is precharged to ground, is connected to a large capacitor Cbuf. This results in charge sharing of the capacitor Cswdn and the capacitor Cbuf and the charge on a regulation output 760 is regulated a step down. In other words the voltage of the common mode regulation signal setCM is regulated one step down. The regulation output 760 may correspond e.g. to the output of the regulation circuit 130 of. FIG. 1 or the output of the regulation circuit 230 of FIG. 2. When the upper inverter 730 is triggered, a capacitor Cswup, which is precharged to a supply voltage VDD, is shortly connected to the capacitor Cbuf. This results in charge sharing and a step up on the regulation output 760.

In summary, the regulation circuit 700 increases or decreases the voltage on the regulation output 760 by adding or subtracting charge packets on the regulation output 760. In other words, the regulation circuit 700 provides a charge pump to add or subtract charge to the regulation output 760. This results in a bang-bang control mechanism.

Figure 8:
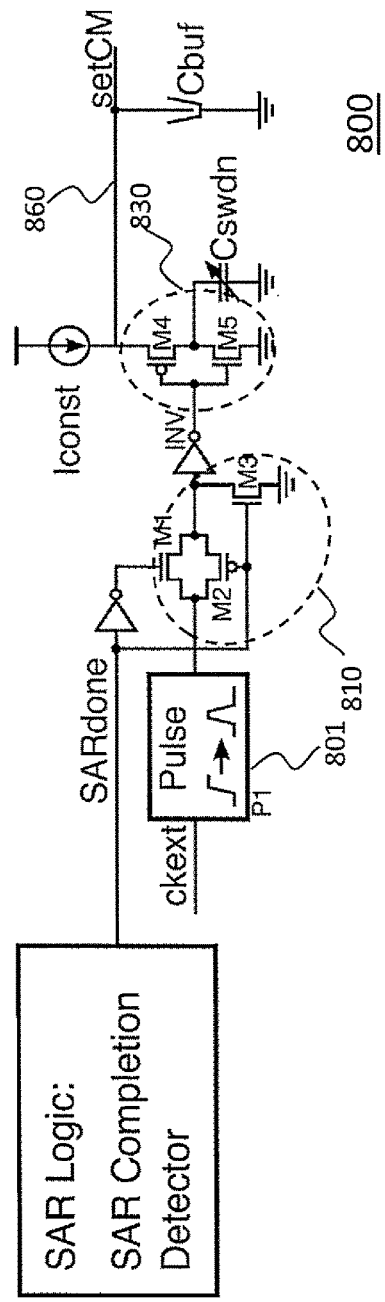
FIG. 8 shows a regulation circuit according to another embodiment.

FIG. 8 shows another exemplary embodiment of a regulation circuit 800 which may be an implementation of the general regulation circuits 130 or 230 of FIG. 1 and FIG. 2 respectively. The regulation circuit 800 receives the external clock signal ckext from an external clock source and the SARdone signal e.g. from the logic unit 120 of FIG. 1.

The regulation circuit 800 comprises a pulse generator 801 which receives the external clock signal ckext. The pulse generator 801 generates a pulse triggered by the rising edge of the external clock signal ckext. This pulse is then forwarded to a first transmission gate 810 comprising a pair of transistors M1 and M2 and a transistor M3 which sets the voltage level at the output of the first transmission 810 gate to ground when the first transmission gate 810 is disabled.

The pulse generated by the pulse generator 810 is forwarded via the first transmission gate 810 to an inverter 830 implemented by a pair of transistors M4 and M5. The regulation circuit 800 further comprises a constant current source Iconst. When SARdone is high when the external clock ckext rises, a pulse is forwarded to the inverter 830, resulting in charge sharing and a step down on the voltage of a regulation output 860, also denoted as setCM. The constant current source Iconst rises the voltage slowly, independent of Iconst. Preferably Iconst should not be too large to facilitate that its effect in a higher setCM can be compensated by the lower pulse path.

With the regulation performed by the regulation circuit according to embodiments of the invention a SAR ADC can be operated in an optimized way. For a predefined conversion time, the actual conversion time of the SAR ADC can be regulated in such a way that the asynchronous operation does not terminate too late and not too early, but rather close to the predefined conversion time. The conversion time of the SAR ADC can preferably be regulated by regulating the common mode of the SAR ADC. This results in an improved trade-off between conversion speed on the one hand and noise and power consumption on the other hand.

Embodiments of the invention may provide the additional advantage that they facilitate the design of asynchronous SAR ADCs. As the SAR ADC according to embodiments of the invention automatically regulates the actual conversion time of the SAR ADC towards the predefined conversion time, the designer of such SAR ADCs does not need to optimize this aspect in the design. This allows e.g. to focus on other aspects that might conflict with an optimal design of the conversion time of the comparators.

Figure 9:
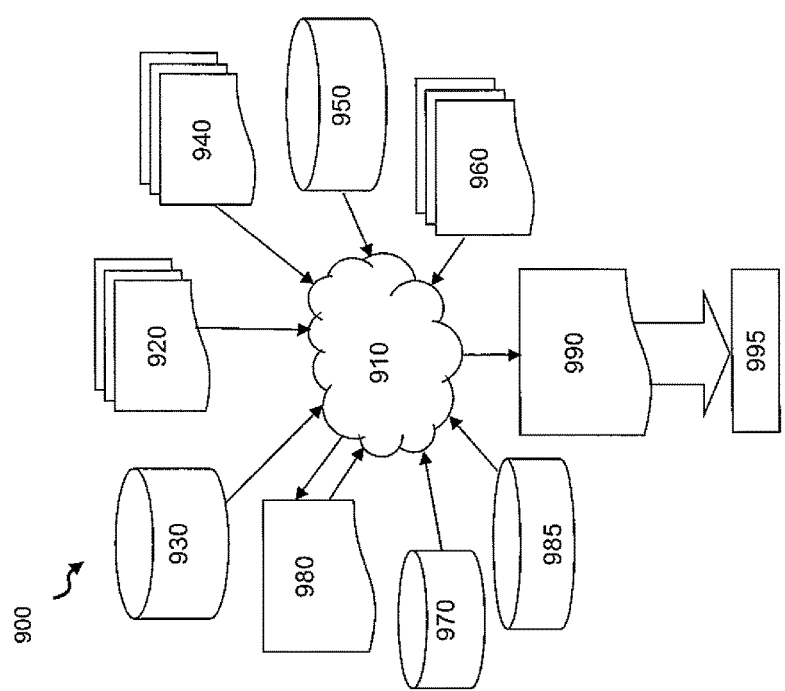
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown e.g. in FIGS. 1, 2, 5, 6, 7 and 8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 5, 6, 7 and 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, 5, 6, 7 and 8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 5, 6, 7 and 8. In one embodiment, design structure 990 may comprise a compiled, executable HDL simulation model that functionally simulates the devices shown in FIGS. 1, 2, 5, 6, 7 and 8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 5, 6, 7 and 8. Design structure 990 may then proceed to a stage 995 where, for example, design structure 990: proceeds to tape-out, is released to manufacturing, is released to a mask house, is sent to another design house, is sent back to the customer, etc.

Figure 10:
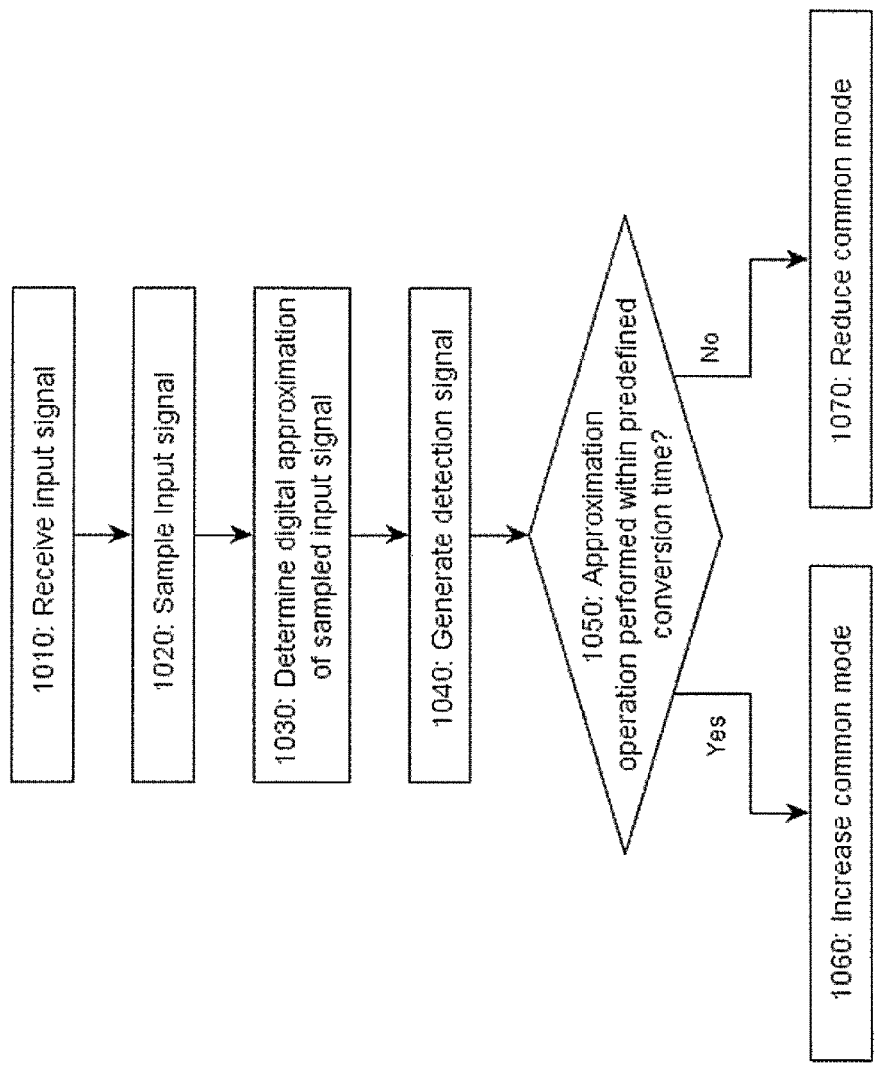
FIG. 10 illustrates a flow chart of a method according to an embodiment of the invention.

FIG. 10 shows a flowchart of a method for performing an analog-to-digital conversion by means of an asynchronously clocked successive approximation analog-to-digital converter (SAR ADC).

In a step 1010, a SAR ADC, e.g. the SAR ADC 100 according to FIG. 1, receives an input signal for which a digital approximation shall be provided by the SAR ADC.

In a step 1020, the input signal is sampled, e.g. by the track & hold unit 106 of FIG. 1.

In a step 1030, a digital approximation of the sampled input signal is determined by means of an asynchronous successive approximation operation. After the asynchronous successive approximation operation has been completed, in a step 1040 a detection signal is generated, which indicates the completion of the asynchronous successive approximation operation. In a step 1050 it is determined, e.g. by the regulation circuit 130 of FIG. 1, whether the asynchronous successive approximation operation was performed within a predefined conversion time. The predefined conversion time may be e.g. the time set by an external clock.

If it is determined that the successive approximation operation was completed within or before the predefined conversion time, then the regulation circuit 130 reduces in a step 1060 the common mode of the SAR ADC, thereby regulating the SAR ADC such that the conversion time of the asynchronous operation is shifted towards the predefined conversion time.

If it is determined that the successive approximation operation was not completed before the predefined conversion time, then the regulation circuit 130 increases in a step 1070 the common mode of the SAR ADC, thereby regulating the SAR ADC such that the conversion time of the asynchronous operation is shifted towards the predefined conversion time.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

As an example, if the comparator of the SAR ADC is embodied as a mirrored comparator, then the steps 1060 and 1070 as described with reference to FIG. 10 would be performed in an alternative way. More particularly, if in an embodiment with a mirrored comparator it is determined that the successive approximation operation was completed within or before the predefined conversion time, then the regulation circuit 130 would increase in the step 1060 the common mode of the SAR ADC. And if it is determined that the successive approximation operation was not completed before the predefined conversion time, then the regulation circuit 130 would decrease in step 1070 the common mode of the SAR ADC.

What is claimed is:

1. An asynchronously clocked successive approximation register analog-to-digital converter (SAR ADC) for providing a digital approximation of a sampled input signal as a result of an asynchronous successive approximation operation, comprising:
 a regulation circuit configured to determine whether the asynchronous successive approximation operation was performed within a predefined conversion time and to regulate the SAR ADC such that the conversion time of the asynchronous operation is shifted towards the predefined conversion time; and
 a comparator configured to compare the sampled input signal with an output signal of a digital-to-analog converter (DAC), wherein the regulation is configured to regulate a common mode of the comparator, wherein the converter comprises an amplifier in front of the comparator, and wherein the regulation circuit is operable to regulate the common mode of the amplifier.

2. A converter according to claim 1, wherein the regulation circuit is configured to regulate the common mode of the SAR ADC such that the conversion time of the asynchronous operation is shifted towards the predefined conversion time.

3. A converter according to claim 2, comprising:
 a sampling circuit configured to sample the input signal;
 a successive approximation register configured to successively apply an approximate digital code of the input signal to the DAC.

4. A converter according to claim 3, comprising a buffer in front of the sampling circuit, wherein the regulation circuit is operable to regulate the common mode of the buffer.

5. A converter according to claim 2, wherein the regulation circuit is adapted to:
 reduce the common mode of the SAR ADC if the successive approximation operation is completed before the predefined conversion time;
 increase the common mode of the SAR ADC if the successive approximation operation is not completed within the predefined conversion time.

6. A converter according to claim 2, wherein the regulation circuit comprises a charge pump for setting the common mode.

7. A converter according to claim 2, wherein the regulation circuit comprises a current source for setting the common mode.

8. A converter according to claim 1, comprising:
 a detector configured to provide a detection signal, the detection signal indicating the completion of the asynchronous successive approximation operation.

9. A converter according to claim 1, wherein the SAR ADC is a single stage SAR ADC.

10. A converter according to claim 1, wherein the SAR ADC is a pipelined SAR ADC comprising two or more stages, and wherein the regulation circuit is operable to regulate at least one of the stages of the pipelined SAR ADC.

11. A converter according to claim 1, wherein the predefined conversion time corresponds to a clock cycle time of an external clock of the SAR ADC.

12. A converter according to claim 1, wherein the predefined conversion time corresponds to a fraction of a clock cycle time of an external clock of the SAR ADC.

13. A method for performing an analog-to-digital conversion by means of an asynchronously clocked successive approximation register analog-to-digital converter (SAR ADC), the method comprising:
 providing a digital approximation of a sampled input signal as a result of an asynchronous successive approximation operation;
 determining whether the asynchronous successive approximation operation was performed within a predefined conversion time;
 regulating the SAR ADC such that the conversion time of the asynchronous operation is shifted towards the predefined conversion time; and
 comparing the sampled input signal with an output signal of a digital-to-analog converter (DAC), wherein the regulating regulates a common mode of the comparing, wherein the converter amplifies after the comparing, and wherein the regulating regulates the common mode after the amplifying.

14. A method according to claim 13, comprising:
 regulating the common mode of the SAR ADC such that the conversion time of the asynchronous operation is shifted towards the predefined conversion time.

15. A method according to claim 14, comprising:
reducing the common mode of the SAR ADC if the successive approximation operation is completed before the predefined conversion time;
increasing the common mode of the SAR ADC if the successive approximation operation is not completed within the predefined conversion time.

16. A method according to claim 13, comprising:
sampling the input signal by a sampling circuit;
successively supplying an approximate digital code of the sampled input signal to the DAC by a successive approximation register.

17. A method according to claim 13, wherein the predefined conversion time corresponds to a clock cycle time of an external clock of the SAR ADC or to a fraction of the clock cycle time of the external clock of the SAR ADC.

18. A design structure tangibly embodied in a machine readable medium for designing, manufacturing, or testing an integrated circuit, the design structure comprising:
an asynchronously clocked successive approximation analog-to-digital converter (SAR ADC) configured to provide a digital approximation of a sampled input signal as a result of an asynchronous successive approximation operation, comprising:
a regulation circuit configured to determine whether the asynchronous successive approximation operation was performed within a predefined conversion time and to regulate the SAR ADC such that the conversion time of the asynchronous operation is shifted towards the predefined conversion time; and
a comparator configured to compare the sampled input signal with an output signal of a digital-to-analog converter (DAC), wherein the regulation is configured to regulate a common mode of the comparator, wherein the converter comprises an amplifier in front of the comparator, and wherein the regulation circuit is operable to regulate the common mode of the amplifier.

19. A design structure according to claim 18, wherein the design structure resides on storage medium as a data format used for the exchange of layout data of integrated circuits.

* * * * *